US007248121B2

(12) United States Patent
Park

(10) Patent No.: US 7,248,121 B2
(45) Date of Patent: Jul. 24, 2007

(54) VARIABLE LOCK-IN CIRCUIT FOR PHASE-LOCKED LOOPS

(75) Inventor: Sangbeom Park, Tracy, CA (US)

(73) Assignee: ANA Semiconductor, Tracy, CA (US)

( * ) Notice: Subject to any disclaimer, the term of this patent is extended or adjusted under 35 U.S.C. 154(b) by 45 days.

(21) Appl. No.: 11/034,341

(22) Filed: Jan. 11, 2005

(65) Prior Publication Data
US 2006/0152289 A1 Jul. 13, 2006

(51) Int. Cl.
*H03L 7/085* (2006.01)
(52) U.S. Cl. .................... 331/1 A; 331/DIG. 2; 331/17
(58) Field of Classification Search .................. 331/17, 331/DIG. 2, 1 A
See application file for complete search history.

(56) References Cited

U.S. PATENT DOCUMENTS

2005/0046497 A1* 3/2005 Nakanishi .................... 331/57

* cited by examiner

*Primary Examiner*—Robert Pascal
*Assistant Examiner*—Levi Gannon

(57) ABSTRACT

The variable lock-in circuits basically include a sensor, triggering transistors, current mirror, current source, an N-bit triggering circuit array, and a feedback line. If the sensing voltage does not reach the expected voltage compared to the midpoint voltage of the sensor, the output voltage of the sensor turns on the triggering transistors, which provide a total current to its output through the current mirror until the voltage at feedback reaches the midpoint voltage. The time to reach the midpoint voltage at a filter is simply equal to the charge stored at the filter divided by the total current, which is controlled by an N-bit digital input and a device aspect ratio of each triggering transistor. Consequently, all variable lock-in circuits provide an initial loop condition closer to the expected loop condition according to schedule.

20 Claims, 7 Drawing Sheets

100

VARIABLE LOCK-IN CIRCUIT FOR PHASE-LOCKED LOOPS

FIELD OF THE INVENTION

The present invention relates to the field of fast-locking phase-locked loops and more particularly to variable lock-in circuit for phase-locked loops.

BACKGROUND ART

Phase-looked loop is a vitally important device. Phase-looked loop is analog and mixed signal building block used extensively in communication, networks, digital systems, consumer electronics, computers, and any other fields that require frequency synthesizing, clock recovery, and synchronization.

Prior Art FIG. 1 illustrates a block diagram of a basic architecture of two types of conventional phase-locked loops, which are a conventional phase-locked loop 110 and a conventional fast-locking phase-locked loop 120. The conventional phase-locked loop 110 typically consists of a phase-frequency detector (or phase detector), a charge-pump, a low-pass filter, a voltage-controlled oscillator, and a frequency divider in a loop. However, to understand phase-locked loops fundamentally, phase-locked loops without any frequency divider in a loop will be considered here. The phase-frequency detector (or phase detector) is a block that has an output voltage with an average value proportional to the phase difference between the input signal and the output of the voltage-controlled oscillator. The charge-pump either injects the charge into the low-pass filter or subtracts the charge from the low-pass filter, depending on the outputs of the phase-frequency detector (or phase detector). Therefore, change in the low-pass filter's output voltage is used to drive the voltage-controlled oscillator. The negative feedback of the loop results in the output of the voltage-controlled oscillator being synchronized with the input signal. As a result, the phase-locked loop is in lock.

In the conventional phase-locked loop 110 of Prior Art FIG. 1, lock-in time is defined as the time that is required to attain lock from an initial loop condition. Assuming that the phase-locked loop bandwidth is fixed, the lock-in time is proportional to the difference between the input signal frequency and the initial voltage-controlled oscillator's frequency as follows:

$$\frac{(\omega_{in} - \omega_{osc})^2}{\omega_0^3}$$

where $\omega_{in}$ is the input signal frequency, $\omega_{osc}$ is the initial voltage-controlled oscillator's frequency, and $\omega_0$ is the loop bandwidth. The loop bandwidth must be wide enough to obtain a fast lock-in time. But the loop bandwidth is also constrained by the input signal frequency. Most systems require a fast lock-in time without regard to the input signal frequency, bandwidth, and output phase jitter due to external noise. However, the conventional phase-locked loop 110 shown in Prior Art FIG. 1 has suffered from slow locking. Thus, time and power are unnecessarily consumed until the phase-locked loops are in lock. In addition, the conventional phase-locked loop 110 has taken a vast amount of time to be simulated and verified before they are fabricated since the simulation time of phase-locked loop circuits is absolutely proportional to time that is required the phase-locked loops to lock. This long simulation adds additional cost and serious bottleneck to better design time to market. In addition, the conventional phase-locked loop 110 has also suffered from harmonic locking. Especially harmonic locking is that the phase-locked loop locks to harmonics of the input signal when a multiplier is used for the phase detector. For these reasons, the conventional phase-locked loop 110 of Prior Art FIG. 1 is very inefficient to implement in an integrated circuit or system-on-chip (SOC).

To overcome the drawbacks of the conventional phase-locked loop 110 of Prior Art FIG. 1, a conventional fast-locking phase-locked loop 120 of Prior Art FIG. 1 is illustrated. The conventional fast-locking phase-locked loop 120 consists of a digital phase-frequency detector, a proportional-integral controller 122, a 10-bit digital-to-analog converter 124, and a voltage-controlled oscillator. Unfortunately, the conventional fast-locking phase-locked loop is costly, complicated, and inefficient to implement in system-on-chip (SOC) or integrated circuit (IC) because additional blocks such as the proportional-integral controller 122 and the 10-bit digital-to-analog converter 124 take much more chip area and consume much more power. Since there are much more functional blocks integrated on the same chip, the chip area of the conventional fast-locking phase-locked loop 120 is about three times as large as that of the conventional phase-locked loop 110. At the same time, complicated additional functional blocks in a loop make the stability analysis very difficult. The complexity increases the number of blocks that need to be designed and verified. This long design and verification adds additional cost and serious bottleneck to better design time to market, too. The conventional fast-locking phase-locked loop 120 might improve the lock-in time, but definitely results in bad time-to-market, higher cost, larger chip area, much more power consumption, and longer design time.

Thus, what is desperately needed is a cost-effective fast-locking phase-locked loop that can be highly efficiently implemented with a drastic improvement in a very fast lock-in time, lock-in time controllability, performance, cost, chip area, power consumption, stand-by time, and fast design time for much better time-to-market. At the same time, serious harmonic locking problems have to be resolved. The present invention satisfies these needs by providing variable lock-in circuits.

SUMMARY OF THE INVENTION

The present invention provides five types of the variable lock-in circuits for phase-locked loops. The variable lock-in circuits simultaneously enable the phase-locked loops to be locked according to schedule. The basic architecture of the variable lock-in circuits consists of a sensor, a cascode current mirror, triggering transistors, current source, and a feedback line. An N-bit binary-weighted triggering circuit array is added into four embodiments in order to control lock-in time more accurately. The sensor senses a voltage at its input. If the sensing voltage does not reach the expected voltage compared to the midpoint voltage of the sensor, the output voltage of the sensor turns on the triggering transistors, which provide a total current to its output through the cascode current mirror until the output voltage reaches the midpoint voltage. The time to reach the midpoint voltage at the filter is simply equal to the charge stored at the filter divided by the total current, which is programmable.

Consequently, all variable lock-in circuits provide a significant reduction in the difference between the initial loop condition and the locked condition in order to overcome serious drawbacks simultaneously. The controllability of lock-in time enables all of the phase-locked loops on the chip to be locked according to schedule. In addition, the present invention has five different embodiments which achieve a drastic improvement in a very fast lock-in time, lock-in time controllability, performance, cost, chip area, power consumption, stand-by time, and design time.

BRIEF DESCRIPTION OF THE DRAWINGS

The accompanying drawings, which are incorporated in and form a part of this specification, illustrate five embodiments of the invention and, together with the description, serve to explain the principles of the invention.

Prior Art

DESCRIPTION OF THE PREFERRED EMBODIMENTS

In the following detailed description of the present invention, five types of the variable lock-in circuits, numerous specific details are set forth in order to provide a through understanding of the present invention. However, it will be obvious to one skilled in the art that the present invention may be practiced without these specific details. In other instances, well known methods, procedures, CMOS digital gates, components, and metal-oxide-semiconductor field-effect transistor (MOSFET) device physics have not been described in detail so as not to unnecessarily obscure aspects of the present invention.

Figure 1:
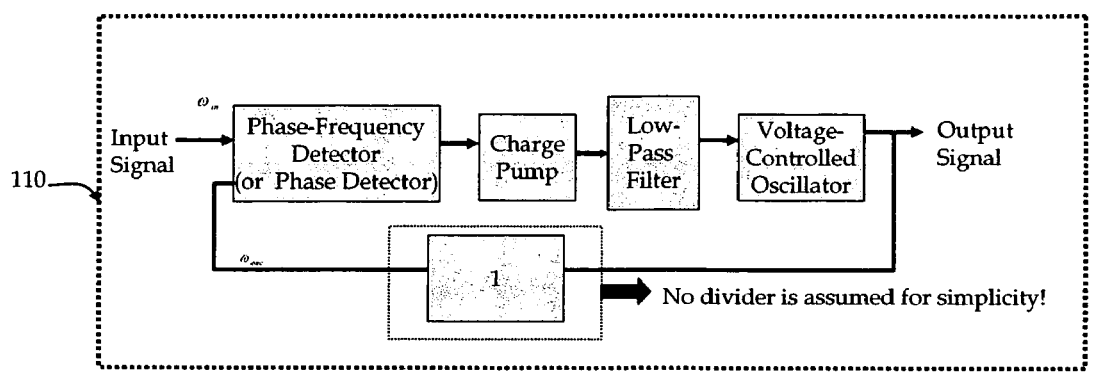
FIG. 1 illustrates a block diagram of two types of conventional phase-locked loops.
Figure 1:
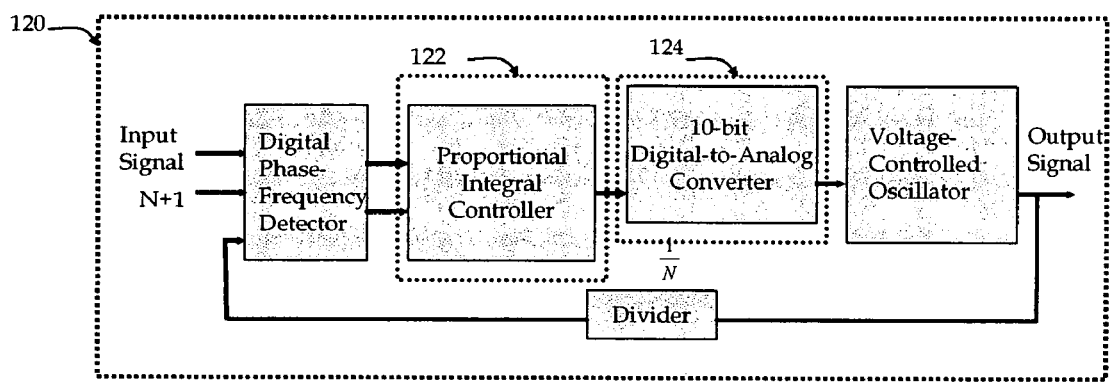
Figure 2:
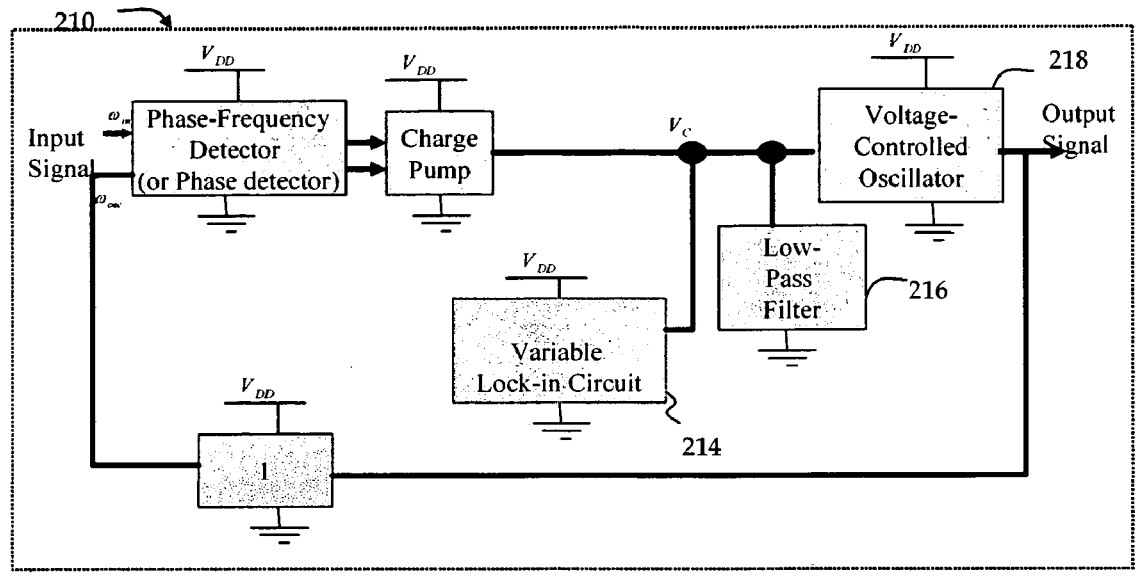
FIG. 2 illustrates a block diagram of two types of variable lock-in circuits for phase-locked loops in accordance with the present invention.
Figure 2:
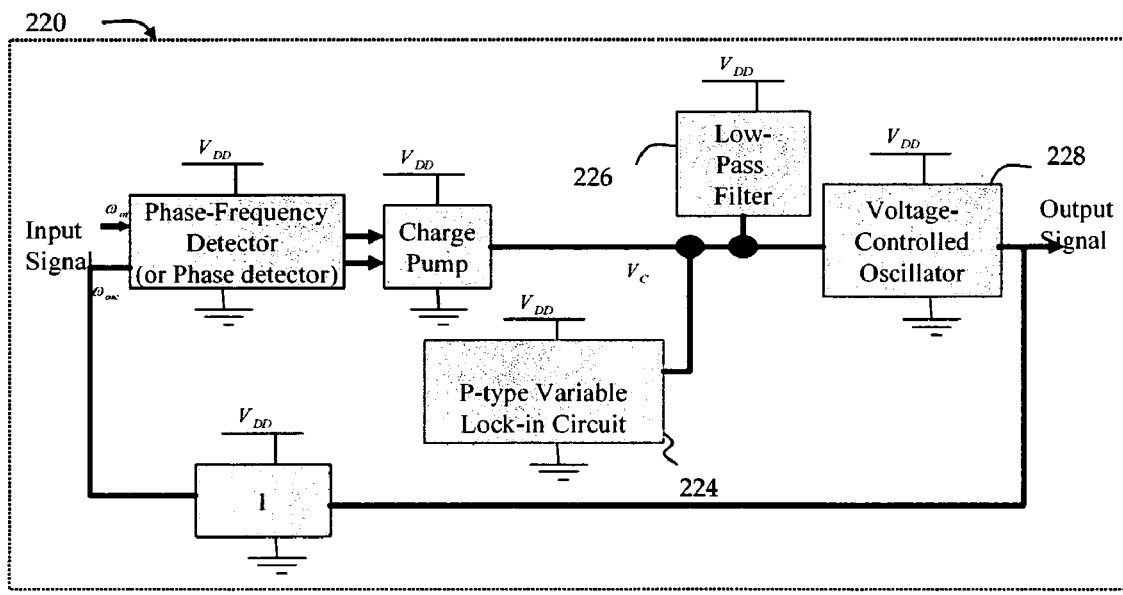

FIG. 2 illustrates a block diagram of two types of the lock-in circuits for phase-locked loops in accordance with the present invention. One type of the lock-in circuit is applied for phase-locked loops including a filter 216 connected between $V_C$ and ground, as seen in the phase-locked loop 210 shown in FIG. 2. The other type of the lock-in circuit called "p-type lock-in circuit" is applied for phase-locked loops including a filter 226 connected between $V_{DD}$ and $V_C$, as seen in the phase-locked loop 220 shown in FIG. 2. To reduce the difference between the initial loop condition and the locked condition, the outputs of the variable lock-in circuit 214 and the p-type variable lock-in circuit 224 are coupled to the outputs of the filter 216 and the filter 226, respectively, as shown in FIG. 2. The phase-locked loop 210 excluding the variable lock-in circuit 214 represents all types of phase-locked loops including a filter 216 connected between $V_C$ and ground without regard to the types of phase-locked loops because the applications of the variable lock-in circuit 214 is independent of architectures and types of phase-locked loops. The phase-locked loop 220 excluding the p-type variable lock-in circuit 224 represents all types of phase-locked loops including a filter 226 connected between $V_{DD}$ and $V_C$ without regard to the types of phase-locked loops because the applications of the p-type variable lock-in circuit 224 is independent of architectures and types of phase-locked loops.

Figure 3:
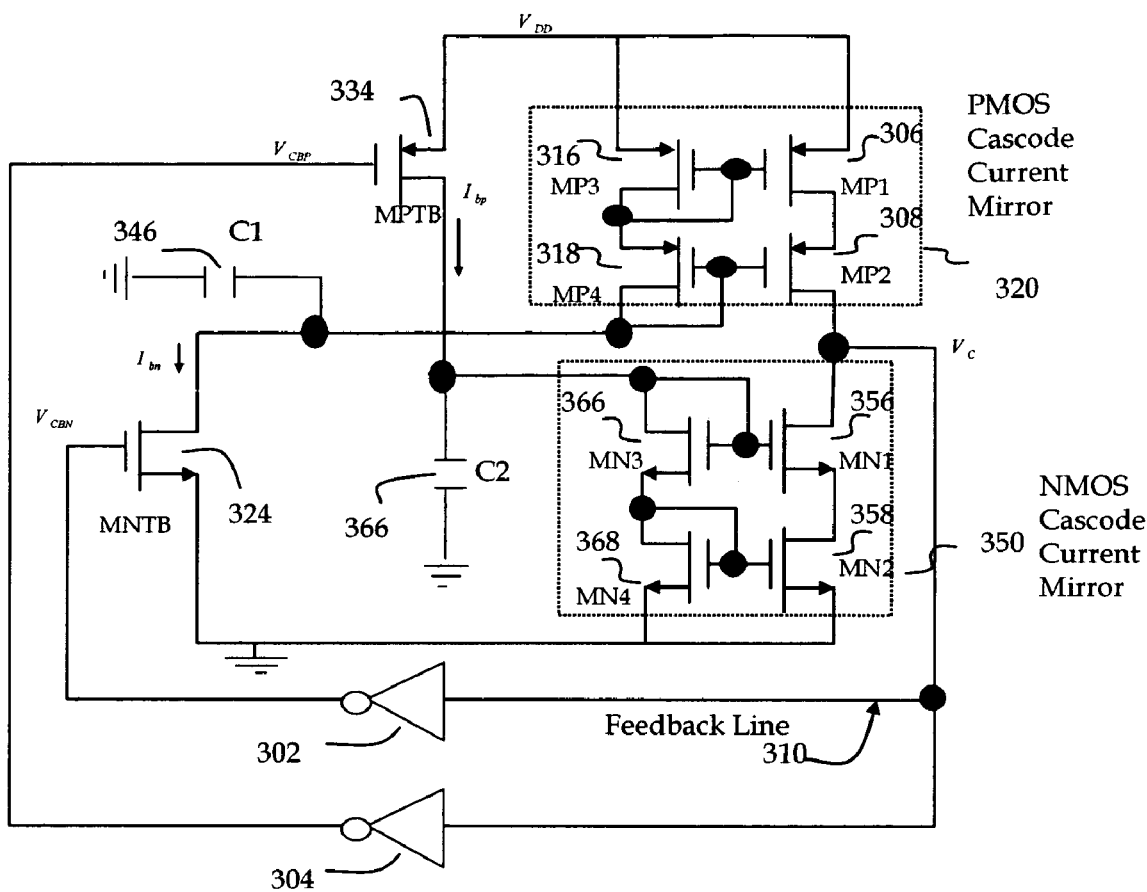
FIG. 3 illustrates a circuit diagram of a dual variable lock-in circuit according to the present invention.

FIG. 3 illustrates a dual variable lock-in circuit according to the present invention. This dual variable lock-in circuit 300 does not have both power-down mode and N-bit binary-weighted triggering circuit array in order to show the fundamental concept of the invention clearly. In practice, the dual variable lock-in circuit 300 is a feedback circuit that consists of a lower voltage sensing inverter 302 (i.e., an odd number of inverters), a triggering NMOS transistor 324, a PMOS cascode current mirror 320, a higher voltage sensing inverter 304 (i.e., an odd number of sensing inverters), a triggering PMOS transistor 334, a NMOS cascode current mirror 350, two capacitors 346 and 366 and a feedback line 310.

The lower-voltage sensing inverter 302 senses a voltage assuming the output of the dual variable lock-in circuit 300 is at ground. Since the lower-voltage sensing inverter 302 initially senses the voltage less than the midpoint voltage of the lower-voltage sensing inverter, the output voltage of the lower-voltage sensing inverter 302 is high enough to turn on the triggering NMOS transistor 324. At the same time, the output voltage of the higher-voltage sensing inverter 304 is high enough to turn off the triggering PMOS transistor 334. Thus, the only triggering NMOS transistor 324 provides a NMOS current, $I_{bn}$, to the output through the PMOS cascode current mirror 320 until the output voltage, $V_C$ goes up to the midpoint voltage, which is decided by the device aspect ratios of the lower-voltage sensing inverter 302. The time to reach the midpoint voltage at the filter is simply equal to the charge stored at the filter divided by the current. A multiple-order filter is assumed to be approximated to the first-order filter with neglecting resistor in the filter for simplicity. Thus, the time to reach the midpoint voltage at the filter connected between $V_C$ and ground is as follows:

$$\Delta t = \frac{V_M C_P}{I_{bn}}$$

where $V_M$ is the midpoint voltage determined by the device aspect ratios of the lower-voltage sensing inverter 302 and $C_P$ is the value of the capacitor in the filter. Thus, the lock-in time of the phase-locked loops including the filter connected between $V_C$ and ground is approximately given by $$\frac{(\omega_{in} - \omega_M)^2}{\omega_0^3} + \frac{V_M C_P}{I_{bn}}$$

where $\omega_{in}$ is the input signal frequency, $\omega_M$ is the voltage-controlled oscillator's frequency for $V_C = V_M$, and $\omega_0$ is the loop bandwidth. This lock-in time varies depending on the device aspect ratio of the triggering NMOS transistor 324.

Likewise, the higher-voltage sensing inverter 304 senses a voltage assuming the output of the dual variable lock-in circuit 300 is at power supply. Since the higher-voltage sensing inverter 304 initially senses the voltage greater than the higher midpoint voltage of the higher-voltage sensing inverter 304, the output voltage of the higher-voltage sensing inverter 304 is low enough to turn on the triggering PMOS transistor 334. At the same time, the output voltage of the lower-voltage sensing inverter 302 is low enough to turn off the triggering NMOS transistor 324. Thus, the only triggering PMOS transistor 334 provides a PMOS current, $I_{bp}$, to the output through the NMOS cascode current mirror 350 until the output voltage, $V_C$, goes down to the higher midpoint voltage, which is decided by the device aspect ratios of the higher-voltage sensing inverter 304. The time to reach the midpoint voltage at the filter connected between $V_C$ and power supply is simply equal to the charge stored at the filter divided by the current. A multiple-order filter is assumed to be approximated to the first-order filter with neglecting resistor in the filter for simplicity. Thus, the time to reach the higher midpoint voltage at the filter connected between $V_C$ and power supply is as follows:

$$\Delta t = \frac{(V_{DD} - V_{M(H)})C_P}{I_{bp}}$$

where $V_{M(H)}$ is the higher midpoint voltage determined by the device aspect ratios of the higher-voltage sensing inverter 304 and $C_P$ is the value of the capacitor in the filter. Thus, the lock-in time of the phase-locked loops including the filter connected between $V_C$ and power supply is approximately given by $$\frac{(\omega_{in} - \omega_{M(H)})^2}{\omega_0^3} + \frac{(V_{DD} - V_{M(H)})C_P}{I_{bp}}$$

where $\omega_{in}$ is the input signal frequency, $\omega_{M(H)}$ is the voltage-controlled oscillator's frequency for $V_C = V_{M(H)}$, and $\omega_0$ is the loop bandwidth. This lock-in time varies depending on the device aspect ratio of the triggering PMOS transistor 334.

The midpoint voltage is a voltage where the input voltage and the output voltage of the inverter are equal in the voltage transfer characteristic. At the midpoint voltage, the transistors of the inverter operate in the saturation mode. This midpoint voltage of inverter is expressed as $$\frac{V_{DD} - V_{T_n} - |V_{T_p}|}{1 + \sqrt{\frac{K_n}{K_p}}} + V_{T_n} \text{ where}$$

$$\frac{K_n}{K_p} = \frac{\mu_n C_{OX}\left(\frac{W}{L}\right)_n}{\mu_p C_{OX}\left(\frac{W}{L}\right)_p}$$

In addition, the capacitor 346 and capacitor 366 are added to the drains of the triggering NMOS transistor 324 and triggering PMOS transistor 334, respectively to attenuate glitches since they provide additional paths to ground. More additional capacitors can be optionally added to necessary nodes in FIG. 3 to attenuate glitches.

In design of the dual variable lock-in circuit of FIG. 3, it is also desirable to use a value for the midpoint voltage, $V_M$, less than $V'_C$ and a value for the higher midpoint voltage, $V_{M(H)}$, greater than $V'_C$. $V'_C$ is the voltage that makes the frequency of the voltage-controlled oscillator equal to the input signal's frequency. The CMOS process variations usually must be considered so that the proper value of the midpoint voltage is chosen for the dual variable lock-in circuit of FIG. 3. In addition, each bulk of four PMOS transistors in the cascode current mirror 320 can be connected to its own N-well to obtain better immunity from substrate noise.

Figure 4:
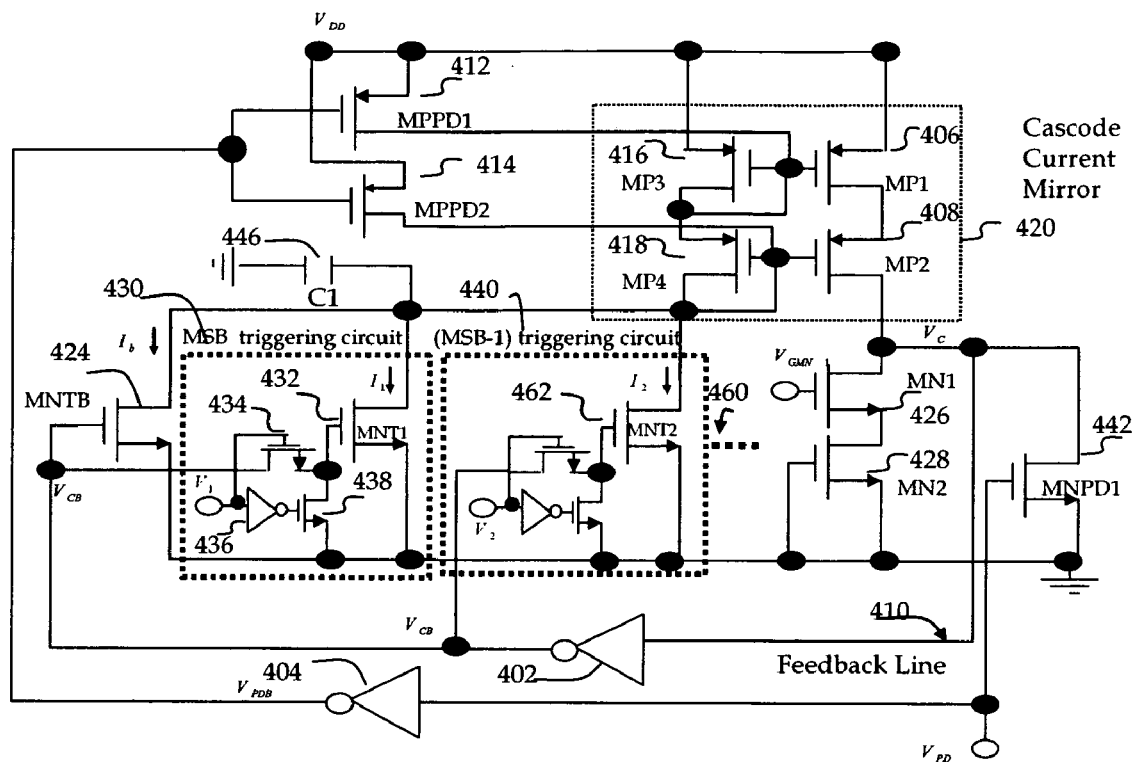
FIG. 4 illustrates a circuit diagram of an N-bit variable lock-in circuit in accordance with the present invention.

FIG. 4 illustrates an N-bit variable lock-in circuit 400 according to the present invention. A power-down input voltage, $V_{PD}$, is defined as the input voltage for power down mode. The power-down enable system is in power down mode when $V_{PD}$ is $V_{DD}$ and it is in normal mode when $V_{PD}$ is zero. In practice, the N-bit variable lock-in circuit 400 is a feedback circuit that consists of a sensing inverter 402 (i.e., an odd number of inverters), a base triggering NMOS transistor 424, a cascode current mirror 420, NMOS transistor current source 426 and 428, two triggering circuits 430 and 440 including triggering NMOS transistors 432 and 462, (N−2) triggering circuits 460, a capacitor 446, and a feedback line 410 with following power-down devices: a power-down inverter 404, two power-down PMOS transistors 412 and 414, and a power-down NMOS transistor 442. In addition, in the NMOS transistor current source, the gate terminal of a NMOS transistor 428 is shorted and the gate of a NMOS transistor 426 is connected to a proper fixed-bias voltage (not shown) or a power supply voltage (e.g., $V_{DD}$, "1", high, etc.). Thus, no current flows into the drains of the NMOS transistors 426 and 428. Especially in the cascode current mirror 420, the transistors MP3 416 and MP4 418 are diode-connected transistors. Two triggering circuits 430 and 440 are shown in FIG. 4 while the dotted lines 460 represent (N−2) triggering circuits (not shown), where N is a predetermined bit length. So, there are totally N triggering circuits since two added (N−2) makes N. N=0 indicates that there is no binary-weighted triggering circuit array in FIG. 4. N=1 indicates that there is only MSB triggering circuit 430 in FIG. 4. N=2 indicates that there are two triggering circuits 430 and 440 in FIG. 4. As seen in the triggering circuits 430 and 440 shown in FIG. 4, triggering NMOS transistors 432 and 462 share the drain terminal with the base triggering NMOS transistor 424 so that currents are added.

The sensing inverter 402 senses a voltage at its input when the circuit mode changes from power-down mode to normal mode. Since the sensing inverter 402 initially senses the input voltage less than the midpoint voltage of the sensing inverter 402, the output voltage of the sensing inverter 402 is high enough to turn on the base triggering NMOS transistor 424. In other words, $V_{CB}$ becomes $V_{DD}$ (e.g., power supply voltage, "1", high, etc.) to turn on the base triggering NMOS transistor 424. However, a control input high with $V_{CB} = V_{DD}$ turns on the corresponding triggering NMOS transistor in the binary-weighted triggering circuit array. The N-bit binary-weighted triggering circuit array with the base triggering NMOS transistor generates a total current provided to the output through the cascode current mirror 420 until the output voltage, $V_C$, goes up to the midpoint voltage, which is decided by the device aspect ratios of the sensing inverter 402. Each amount of current is decided by scaling the device aspect ratio of each triggering NMOS transistor. $I_1$ through $I_n$ would be controlled by the binary bit coefficients associated with an N-bit digital input signal. Hence, the total current, $I_{TOTAL}$, corresponding to an N-bit digital input is given as follows:

$$I_{TOTAL} = I_b + (b_1 I_1) + (b_2 I_2) + (b_3 I_3) \ldots + (b_n I_n)$$

where $b_1, b_2, \ldots, b_n$ are the binary bit coefficients having a value of either a "1" or "0". The binary coefficient $b_1$ represents the most significant bit (i.e., MSB) while $b_n$ represents the least significant bit (i.e., LSB). For instance, the binary bit coefficient $b_1$ is 1 if $V_1$ is high. Furthermore, the time to reach the midpoint voltage at the filter is simply equal to the charge stored at the filter divided by the total current. If a multiple-order filter is assumed to be approximated to the first-order circuit with neglecting resistor in the filter for simplicity. Thus, the time to reach the midpoint voltage at the filter connected between $V_C$ and ground, corresponding to an N-bit digital input is as follows:

$$\Delta t = \frac{V_M C_P}{I_b + (b_1 I_1) + (b_2 I_2) + (b_3 I_3) \ldots + (b_n + I_n)}$$

where $V_M$ is the midpoint voltage determined by the device aspect ratios of the sensing inverter 402 and $C_P$ is the value of the capacitor in the filter. Therefore, the lock-in time of the phase-locked loops including the filter connected between $V_C$ and ground is approximately given by $$\frac{(\omega_{in} - \omega_M)^2}{\omega_0^3} + \frac{V_M C_P}{I_b + (b_1 I_1) + (b_2 I_2) + (b_3 I_3) \ldots + (b_n + I_n)}$$

where $\omega_{in}$ is the input signal frequency, $\omega_M$ is the voltage-controlled oscillator's frequency for $V_C = V_M$, and $\omega_0$ is the loop bandwidth. It is noted that the lock-in time is programmed by an N-bit digital input.

As seen in the MSB triggering circuit 430, it is also noted that each triggering circuit is comprised of a triggering NMOS transistor, two NMOS switches (or CNOS switches), and an inverter. Two NMOS (or CMOS) switches 434 and 438 are coupled to the gate terminal of the triggering NMOS transistor 432 in order to turn completely off the triggering NMOS transistor 432. In particular, the gate of the NMOS (or CMOS) switch 438 is controlled by the inverting control input, $\overline{V}_1$, through an inverter 436 while the gate of the NMOS (or CMOS) switch 434 is controlled by the non-inverting control input, $V_1$. In addition, the capacitor 446 is added to the drain of the triggering NMOS transistors to attenuate glitches since it provides additional paths to ground. More additional capacitors can be optionally added to necessary nodes in FIG. 4 to attenuate glitches.

In design of the N-bit variable lock-in circuit of FIG. 4, it is also desirable to use a value for the midpoint voltage, $V_M$, less than the voltage that makes the frequency of the voltage-controlled oscillator equal to the input signal's frequency. The CMOS process variations usually must be considered so that the proper value of the midpoint voltage is chosen for the N-bit variable lock-in circuit of FIG. 4. In addition, each bulk of four PMOS transistors in the current mirror 420 can be connected to its own N-well to obtain better immunity from substrate noise. It is desirable to use the N-bit variable lock-in circuit 400 for all types of phase-locked loops including the filter connected between $V_C$ and ground.

Since the power-down input voltage, $V_{PD}$, becomes $V_{DD}$ for power-down mode, the power-down NMOS transistor 442 is on during power-down mode and thus provides an output pull-down path to ground. Thus, $V_C$ of the N-bit variable lock-in circuit 400 is zero during power-down mode. Zero dc volt at $V_C$ ensures that no current flows into the circuits during power-down mode.

Figure 5:
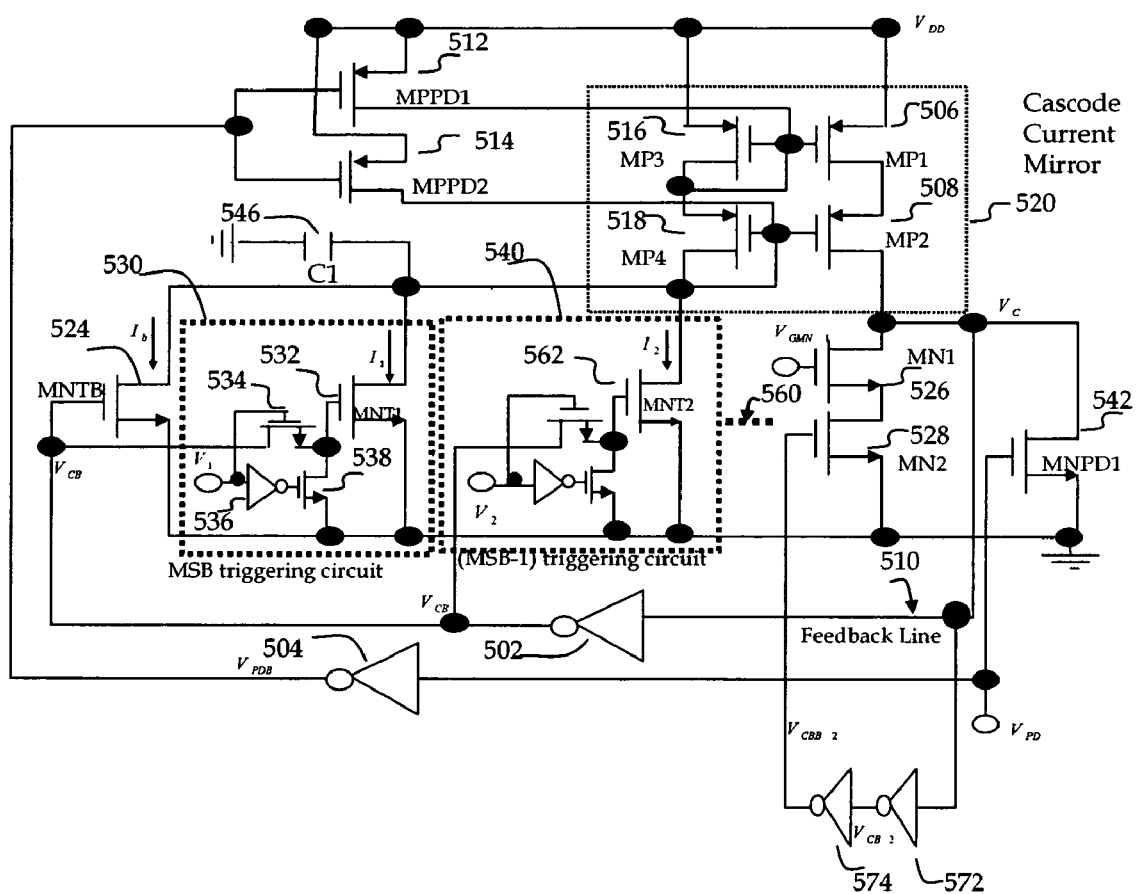
FIG. 5 illustrates a circuit diagram of an N-bit dual variable lock-in circuit according to the present invention.

FIG. 5 illustrates an N-bit dual variable lock-in circuit 500 in accordance with the present invention. The N-bit dual variable lock-in circuit 500 is a modification of the circuit described in FIG. 4. As shown in FIG. 5, it is noted that the gate terminal of a NMOS transistor 528 is connected to the output of the second higher-voltage sensing inverter 574 and the gate of a NMOS transistor 526 is connected to a proper fixed-bias voltage (not shown) or a power supply voltage (e.g., $V_{DD}$, "1", high, etc.). The first difference to note here is that the gate of the NMOS transistor 528 is not shorted in FIG. 5 while the gate terminal of a NMOS transistor 428 is shorted in the NMOS transistor current source in FIG. 4.

Also, the higher-voltage sensing inverters 572 and 574 (i.e., an even number of inverters) are added into FIG. 5 in order to provide the higher-voltage sensing function. The N-bit dual variable lock-in circuit 500 is able to sense the lower-voltage as well as the higher-voltage while the N-bit variable lock-in circuit 400 is able to sense only the lower-voltage.

No current flows into the drains of the NMOS transistors 526 and 528 assuming $V_C < V_{M(H)}$ where $V_{M(H)}$ is the higher midpoint voltage decided by the device aspect ratios of the first higher-voltage sensing inverter 572. If $V_C$ is greater than $V_{M(H)}$, the output voltage of the first higher-voltage sensing inverter 572 is low and thus the output voltage of the second higher-voltage sensing inverter 574 is $V_{DD}$. Therefore, the NMOS transistor 528 is on and thus a constant current flows into the drains of the NMOS transistors 526 and 528 until $V_C$ goes down to $V_{M(H)}$. In this case, the constant current is not programmable and an amount of the constant current depends on device aspect ratio of the NMOS transistor 528.

In design of the N-bit dual variable lock-in circuit of FIG. 5, it is also desirable to use a value for the midpoint voltage, $V_M$, less than $V'_C$ and a value for the higher midpoint voltage, $V_{M(H)}$, greater than $V'_C$. $V'_C$ is the voltage that makes the frequency of the voltage-controlled oscillator equal to the input signal's frequency. $V_M$ is the midpoint voltage decided by the device aspect ratios of the lower-voltage sensing inverter 502.

It is desirable to use the N-bit dual variable lock-in circuit 500 for all types of phase-locked loops including the filter connected between $V_C$ and ground. The operations and principles of power down mode shown in FIG. 5 are the same as those of the circuit shown in FIG. 4. Zero dc volt at $V_C$ ensures that no current flows into the circuits during power-down mode.

Figure 6:
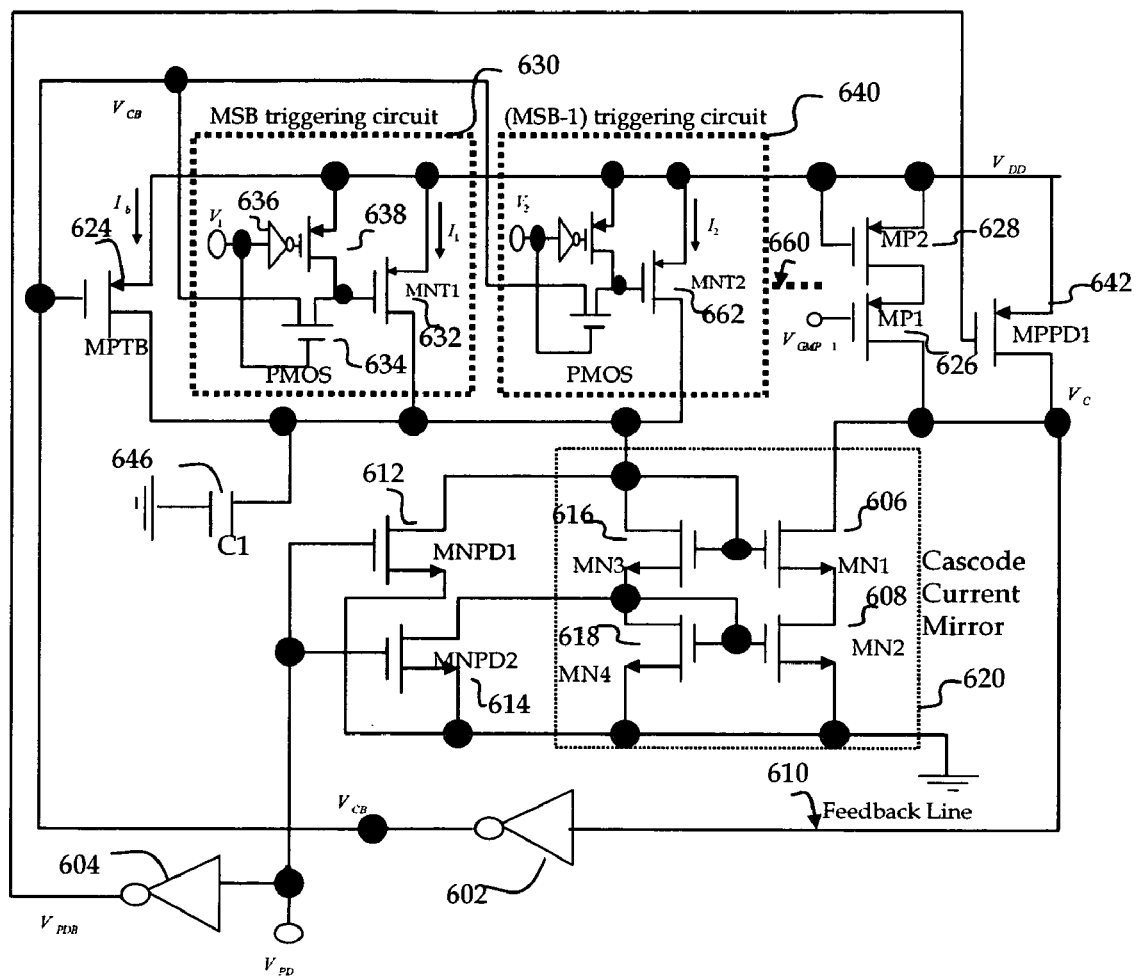
FIG. 6 illustrates a circuit diagram of an N-bit p-type variable lock-in circuit in accordance with the present invention.

FIG. 6 illustrates an N-bit p-type variable lock-in circuit 600 according to the present invention. The power-down input voltage, $V_{PD}$, is defined as the input voltage for the p-type power down mode as well as for the power down mode. In addition, p-type power down mode can also be termed the power-down mode, too. The p-type power-down enable system is in power down mode when $V_{PD}$ is $V_{DD}$ and it is in normal mode when $V_{PD}$ is zero. In practice, the N-bit p-type variable lock-in circuit 600 is a feedback circuit that consists of a higher-voltage sensing inverter 602 (i.e., an odd number of inverters), a base triggering PMOS transistor 624, a cascode current mirror 620, PMOS transistor current source 628 and 626, a capacitor 646, two triggering circuits 630 and 640, (N−2) triggering circuits 660, and a feedback line 610 with following power-down devices: a power-down inverter 604, two power-down NMOS transistors 612 and 614, and a power-down PMOS transistor 642. In addition, it is noted that the gate terminal of a PMOS transistor 628 is connected to a power supply voltage (e.g., $V_{DD}$, "1", high, etc.) and the gate of a PMOS transistor 626 is connected to a proper fixed-bias voltage (not shown) or ground (e.g., "0", low, etc.). Since the PMOS transistor 628 is turned off, no current flows out of the drains of the PMOS transistors 628 and 626. Also, $V_{M(H)}$ is the higher midpoint voltage decided by the device aspect ratios of the higher-voltage sensing inverter 602. Also, in the cascode current mirror 620 shown in FIG. 6, the transistors MN3 616 and MN4 618 are diode-connected transistors. Two triggering circuits 630 and 640 are shown in FIG. 6 while the dotted lines 660 represent (N−2) triggering circuits (not shown), where N is a predetermined bit length. So, there are totally N triggering circuits since two added (N−2) makes N. N=0 indicates that there is no binary-weighted triggering circuit array in FIG. 6. N=1 indicates that there is only MSB triggering circuit 630 in FIG. 6. N=2 indicates there are two triggering circuits 630 and 640 in FIG. 6.

The higher-voltage sensing inverter 602 senses a voltage at its input when the circuit mode changes from p-type power-down mode to normal mode. Since the higher-voltage sensing inverter 602 initially senses $V_{DD}$ greater than $V_{M(H)}$, the output voltage of the higher-voltage sensing inverter 602 is low enough to turn on the base triggering PMOS transistors 624. In other words, $V_{CB}$ becomes zero (e.g., ground, "0", low, etc.) to turn on the base triggering PMOS transistors 624. However, a control input low with $V_{CB}=0$ turns on the corresponding triggering PMOS transistor in the binary-weighted triggering circuit array. The binary-weighted triggering circuit array with the base triggering PMOS transistor generates a total current provided to the output through the cascode current mirror 620 until the output voltage, $V_C$, goes down to $V_{M(H)}$. Each amount of current is decided by scaling the device aspect ratio of each triggering PMOS transistor. $I_1$ through $I_n$ would be controlled by the binary bit coefficients associated with an N-bit digital input signal. Hence, the N-bit p-type variable lock-in circuit 600 provides the total current as follows:

$$I_{TOTAL} = I_b + (b_1 I_1) + (b_2 I_2) + (b_3 I_3) \ldots + (b_n I_n)$$

For example, the binary bit coefficient $b_1$ is 1 if $V_1$ is low. A multiple-order filter is assumed to be approximated to the first-order filter with neglecting resistor in the filter for simplicity. Thus, the lock-in time of the phase-locked loops including the filter connected between $V_C$ and power supply is approximately given by $$\frac{(\omega_{in} - \omega_{M(H)})^2}{\omega_0^3} + \frac{(V_{DD} - V_{M(H)})C_P}{I_{bp}}$$

where $\omega_{in}$ is the input signal frequency, $\omega_{M(H)}$ is the voltage-controlled oscillator's frequency for $V_C = V_{M(H)}$, and $\omega_0$ is the loop bandwidth. Also, $C_P$ is the value of the capacitor in the filter and $V_{M(H)}$ is the higher midpoint voltage determined by the device aspect ratios of the higher-voltage sensing inverter 304. It is noted that the lock-in time is programmed by an N-bit digital input.

As seen in the MSB triggering circuit 630, it is also noted that each triggering circuit is comprised of a triggering PMOS transistor, two PMOS switches (or CNOS switches), and an inverter. In addition, the capacitor 646 is added to the drain of the triggering PMOS transistors to attenuate glitches since it provides additional paths to ground. More additional capacitors can be optionally added to necessary nodes shown in FIG. 6 to attenuate glitches.

In design of the N-bit p-type variable lock-in circuit of FIG. 6, it is also desirable to use a value for the higher midpoint voltage, $V_{M(H)}$, greater than the voltage that makes the frequency of the voltage-controlled oscillator equal to the input signal's frequency. The CMOS process variations usually must be considered so that the proper value of the midpoint voltage is chosen for the N-bit p-type variable lock-in circuit of FIG. 6. In addition, each bulk of four PMOS transistors in the current mirror 620 can be connected to its own N-well to obtain better immunity from substrate noise. It is desirable to use the N-bit p-type variable lock-in circuit 600 for all types of phase-locked loops including the filter connected between $V_C$ and power supply.

If $V_{PD}$ becomes $V_{DD}$ during power-down mode, the output voltage of the power-down inverter, $V_{PDB}$, is zero, which turns on the power-down PMOS transistor 642 during power-down mode and thus provides an output pull-up path to $V_{DD}$. Therefore, the $V_C$ of the N-bit p-type variable lock-in circuit 600 is $V_{DD}$. $V_C = V_{DD}$ ensures that no current flows into the circuits during power-down mode. On the contrary, it was stated earlier that $V_C$ must be zero when power-down mode occurs in FIG. 4 and FIG. 5.

Figure 7:
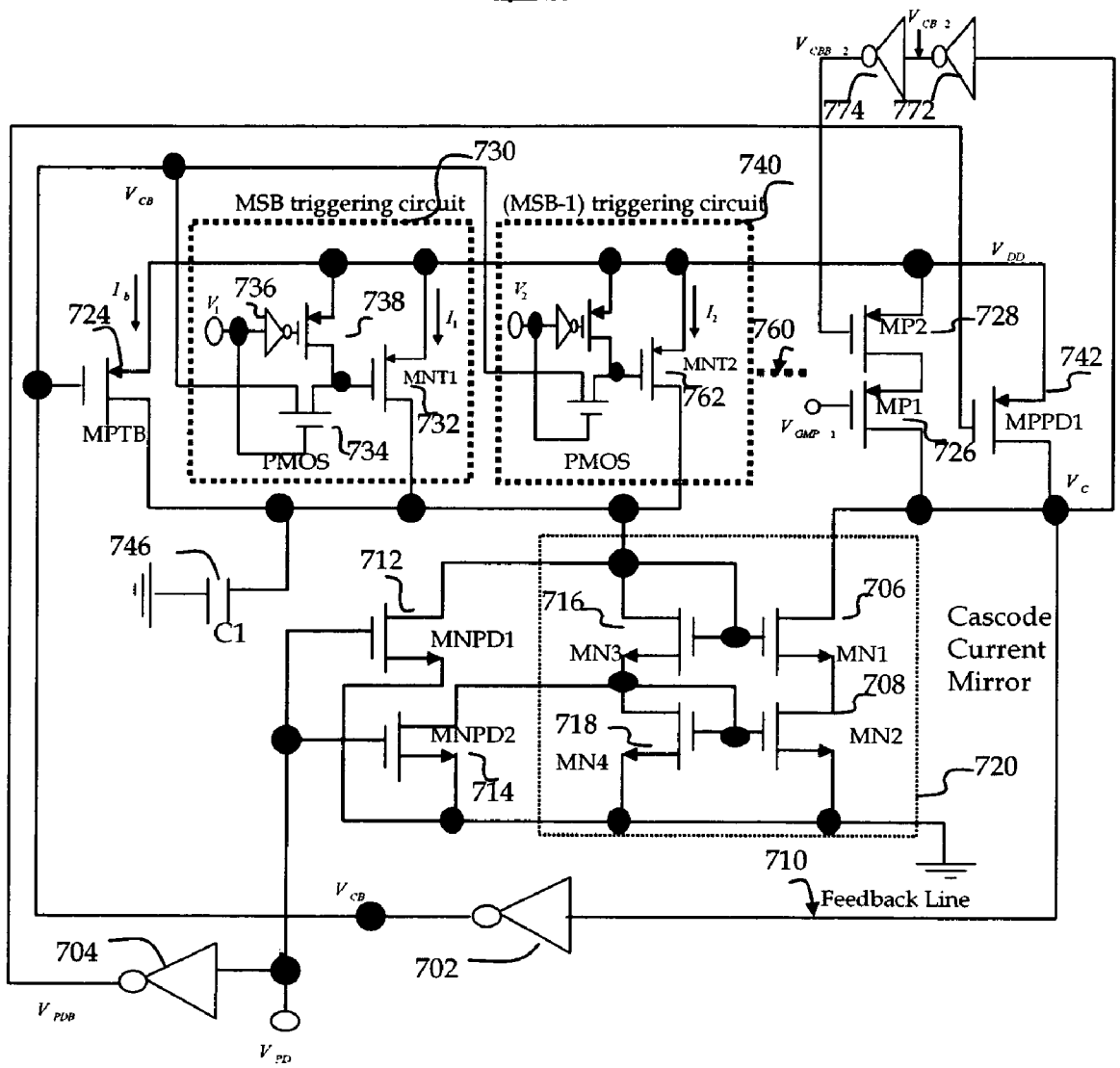
FIG. 7 illustrates a circuit diagram of an N-bit p-type dual variable lock-in circuit according to the present invention.

FIG. 7 illustrates an N-bit p-type dual variable lock-in circuit 700 in accordance with the present invention. The N-bit p-type dual variable lock-in circuit 700 is a modification of the circuit described in FIG. 6. As shown in FIG. 7, it is noted that the gate terminal of a PMOS transistor 728 is connected to the output of the second lower-voltage sensing inverter 774 and the gate of a PMOS transistor 726 is connected to a proper fixed-bias voltage (not shown) or ground (e.g., "0", low, etc.). The first difference to note here is that the PMOS transistor 728 is on in FIG. 7 while the PMOS transistor 628 is off in FIG. 6. Also, the lower-voltage sensing inverters 772 and 774 (i.e., an even number of inverters) are added into FIG. 7 in order to sense the lower-voltage. The N-bit p-type dual variable lock-in circuit 700 is able to sense the lower-voltage as well as the higher voltage while the N-bit p-type variable lock-in circuit 600 is able to sense the higher voltage.

No current flows out of the drains of the PMOS transistors 728 and 726 if $V_C$ is greater than $V_M$. $V_M$ is the lower midpoint voltage decided by the device aspect ratios of the first lower-voltage sensing inverter 772. If $V_C$ is less than $V_M$, the PMOS transistor 728 is turned on until $V_C$ goes up to $V_M$. In other words, a constant current flows out of the drains of the PMOS transistors 728 and 726 until $V_C$ goes up to $V_M$. In this case, the constant current is not programmable and the amount of the constant current depends on device aspect ratio of the PMOS transistor 728.

In design of the N-bit p-type dual variable lock-in circuit of FIG. 7, it is also desirable to use a value for the higher midpoint voltage, $V_{M(H)}$, greater than $V'_C$ and a value for the lower midpoint voltage, $V_M$, less than $V'_C$. $V'_C$ is the voltage that makes the frequency of the voltage-controlled oscillator equal to the input signal's frequency. It is desirable to use the N-bit p-type dual variable lock-in circuit 700 for all types of phase-locked loops including the filter connected between $V_C$ and power supply. $V_C = V_{DD}$ in the N-bit p-type dual variable lock-in circuit 700 ensures that no current flows into the circuits during power-down mode.

In summary, the five variable lock-in circuits of the present invention control how fast the phase-locked loops are locked from an initial condition. Also, they provide a solution for harmonic locking problem. Furthermore, three variable lock-in circuits 300, 500, and 700 are highly effective for LC oscillator which has a very narrow tuning range. The dual variable lock-in circuit 300 is used in application that does not require any programmability of lock-in time. The balance between PMOS output resistance and NMOS output resistance is important since all the variable lock-in circuits of the present invention use the cascode current mirror.

The variable lock-in circuit 214 shown in FIG. 2 represents the dual variable lock-in circuit 300, the N-bit variable lock-in circuit 400, and the N-bit dual variable lock-in circuit 500, as shown in FIG. 3, FIG. 4, and FIG. 5, respectively. Also, the p-type variable lock-in circuit 224 shown in FIG. 2 represents the dual variable lock-in circuit 300, the N-bit p-type variable lock-in circuit 600 and the N-bit p-type dual variable lock-in circuit 700, as shown in FIG. 3, FIG. 6, and FIG. 7, respectively.

It is noted that SPICE is used for the simulation of phase-locked loops. The conventional phase-locked loop 100 and the phase-locked loop 210 including the dual variable lock-in circuit 300 of the invention are simulated using the same components. As a result, the total simulation time of the conventional phase-locked loop 100 is 20 hours and that of the phase-locked loop systems 210 using the device aspect ratio, $$\left(\frac{W}{L}\right)_{MNTB} = \frac{6u}{1u},$$

of the base triggering NMOS transistor 324 is 2 hours. This improvement can be accomplished by simply inserting a proper one of the five variable lock-in circuits into any conventional phase-locked loop, and the simulation time can be reduced by a factor of 10. So far, it should be noted that the same time step has been used for the SPICE simulation in order to accurately measure and compare the simulation time of all circuits.

All the variable lock-in circuits of the present invention are very efficient to implement in system-on-chip (SOC) or integrated circuit (IC). The present invention provides five different embodiments which achieve a drastic improvement in a very fast lock-in time, lock-in time controllability, performance, time-to-market, power consumption, stand-by time, cost, chip area, and design time. While the present invention has been described in particular embodiments, it should be appreciated that the present invention should not be construed as being limited by such embodiments, but rather construed according to the claims below.

What is claimed is:

1. A variable lock-in circuit for enabling any phase-locked loop including a filter to be locked according to schedule, comprising:
   a feedback line connected to an output and an input of the variable lock-in circuit and also coupled to an output of a filter;
   a sensor for sensing a voltage at the output, comparing with a midpoint voltage decided by device aspect ratios of the sensor, and providing its corresponding response;
   an N-bit binary-weighted triggering circuit array with a base triggering transistor for generating a current corresponding to both an N-bit digital input and an output of the sensor;
   a base triggering transistor for generating a base current corresponding to only an output of the sensor;
   a current mirror for receiving a total current and providing the total current to the filter output until a voltage at the filter output reaches the midpoint voltage according to schedule; and
   a current source coupled to the current mirror and the filter output.

2. The circuit as recited in claim 1 wherein the sensor is inverter.

3. The circuit as recited in claim 1 wherein the sensor is comparator.

4. The circuit as recited in claim 1 wherein the sensor is operational amplifier.

5. The circuit as recited in claim 1 wherein the sensor is CMOS NAND gate since the two-input CMOS NAND gate can be used as an enabling inverter with one input serving as an active high enable input and the other used as the logical input.

6. The circuit as recited in claim 1 wherein the sensor is CMOS NOR gate since the two-input CMOS NOR gate can be used as an enabling inverter with one input serving as an active low enable input and the other used as the logical input.

7. The circuit as recited in claim 1 wherein an odd number of CMOS sensing inverters control the gates of triggering NMOS transistors coupled to the PMOS transistor current mirror.

8. The circuit as recited in claim 1 wherein an odd number of CMOS sensing inverters control the gates of triggering PMOS transistors coupled to the NMOS transistor current mirror.

9. The circuit as recited in claim 1 wherein an even number of CMOS sensing inverters directly control the gate of NMOS transistor in current source if there are not additional NMOS transistor current mirror and N-bit triggering circuit array including triggering PMOS transistors which are coupled each other.

10. The circuit as recited in claim 1 wherein an even number of CMOS sensing inverters directly control the gate of PMOS transistor in current source if there are not additional PMOS current mirror and N-bit triggering circuit array including triggering NMOS transistors which are coupled each other.

11. The circuit as recited in claim 1 wherein capacitors are added to necessary nodes.

12. The circuit as recited in claim 1 wherein the current mirror is cascode current mirror.

13. The circuit as recited in claim 1 wherein the current mirror is Wilson current mirror.

14. The circuit as recited in claim 1 wherein the current mirror is simple current mirror.

15. The circuit as recited in claim 1 wherein power-down inverter and power-down transistors are further added to turn off all transistors and CMOS gates so that no current flows into the circuit during power-down mode.

16. The circuit as recited in claim 1 wherein the output of the variable lock-in circuit is coupled to the output of a filter connected between the output and ground.

17. The circuit as recited in claim 16 wherein the output of the variable lock-in circuit is at ground to ensure that no current flows into the circuit when a power-down input is at the power supply.

18. The circuit as recited in claim 1 wherein the output of the variable lock-in circuit is coupled to the output of a filter connected between the output and power supply.

19. The circuit as recited in claim 18 wherein the output of the variable lock-in circuit is at power supply to ensure that no current flows into the circuit when a power-down input is at the power supply.

20. The circuit as recited in claim 1 wherein the variable lock-in circuit is applied to all phase-locked loops including at least a filter without regard to architectures, topologies, and schematics.

* * * * *